(12) United States Patent
Tai et al.

(10) Patent No.: US 12,706,589 B2
(45) Date of Patent: Aug. 11, 2026

(54) PIEZOELECTRIC VIBRATING SUBSTRATE AND PIEZOELECTRIC VIBRATING ELEMENT

(71) Applicant: NGK INSULATORS, LTD., Nagoya-city (JP)

(72) Inventors: Tomoyoshi Tai, Inazawa-City (JP); Yudai Uno, Nagoya-City (JP); Keiichiro Asai, Nagoya-City (JP); Ryosuke Hattori, Ichinomiya-City (JP); Masato Niwa, Inuyama-City (JP); Masahiko Namerikawa, Seto-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 1079 days.

(21) Appl. No.: 17/851,230

(22) Filed: Jun. 28, 2022

(65) Prior Publication Data

US 2022/0329230 A1 Oct. 13, 2022

Related U.S. Application Data

(63) Continuation of application No. PCT/JP2021/000351, filed on Jan. 7, 2021.

(30) Foreign Application Priority Data

Jan. 10, 2020 (JP) ................................ 2020-003003

(51) Int. Cl.
*H03H 9/17* (2006.01)
*H10N 30/87* (2023.01)

(52) U.S. Cl.
CPC .......... *H03H 9/172* (2013.01); *H10N 30/871* (2023.02)

(58) Field of Classification Search
CPC ............................ H03H 9/172; H10N 30/871
See application file for complete search history.

(56) References Cited

U.S. PATENT DOCUMENTS 5,771,555 A 6/1998 Eda et al.
6,984,843 B2 1/2006 Higuchi et al.
7,348,715 B2 3/2008 Torii et al.
2009/0201337 A1* 8/2009 Li ......................... B41J 2/1646 29/25.35
2010/0112233 A1 5/2010 Iwamoto et al.
2012/0198672 A1 8/2012 Jeda et al.
2017/0125662 A1* 5/2017 Iwamoto ............. H10N 30/073
(Continued)

FOREIGN PATENT DOCUMENTS

DE 69429848 T2 9/2002
DE 602005002060 T2 12/2007
(Continued)

OTHER PUBLICATIONS

International Search Report with English Translation issued in corresponding International Application No. PCT/JP2021/000351 date of mailing Mar. 16, 2021 (5 pages).
(Continued)

*Primary Examiner* — Bryan P Gordon
(74) *Attorney, Agent, or Firm* — FLYNN THIEL, P.C.

(57) ABSTRACT

A piezoelectric vibrating device includes a piezoelectric layer composed of a bulk piezoelectric material, a lower electrode on a first surface of the piezoelectric layer and a supporting substrate bonded with the lower electrode.

8 Claims, 8 Drawing Sheets

(56) References Cited

U.S. PATENT DOCUMENTS

| | | | | |
|---|---|---|---|---|
| 2019/0222189 | A1* | 7/2019 | Tai | H03H 9/02834 |
| 2020/0168787 | A1* | 5/2020 | Ikeuchi | H03H 9/02433 |
| 2021/0066577 | A1 | 3/2021 | Tai et al. | |
| 2021/0111332 | A1* | 4/2021 | Uno | H03H 9/02574 |
| 2021/0111698 | A1* | 4/2021 | Uno | H03H 9/02574 |

FOREIGN PATENT DOCUMENTS

| | | | |
|---|---|---|---|
| DE | 60315535 | T2 | 5/2008 |
| JP | 2010109950 | A | 5/2010 |
| JP | 2012165132 | A | 8/2012 |
| JP | 201486400 | A | 5/2014 |
| JP | 2014154740 | A | 8/2014 |
| JP | 2014225596 | A | 12/2014 |
| WO | 2019054238 | A1 | 3/2019 |
| WO | 2019220713 | A1 | 11/2019 |
| WO | 2019244461 | A1 | 12/2019 |
| WO | 2019244471 | A1 | 12/2019 |

OTHER PUBLICATIONS

Written Opinion of International Searching Authority issued in corresponding International Application No. PCT/JP2021/000351 dated Mar. 16, 2021 (4 pages).

Notice of Reasons for Refusal with English translation issued in corresponding Japanese Application No. 2021-520631 dated Aug. 5, 2021 (10 pages).

Taiwan Office Action issued in corresponding Taiwan Application No. 110100695 dated Apr. 25, 2023 (6 pages).

English Translation of the International Preliminary Report on Patentability, issued in corresponding International Application No. PCT/JP2021/000351, Date of Mailing Jul. 21, 2022 (6 pages).

German Office Action with English translation issued in corresponding German Application No. 11 2021 000 498.0, mailed Sep. 16, 2025 (14 pages).

* cited by examiner

FIG. 4(a)
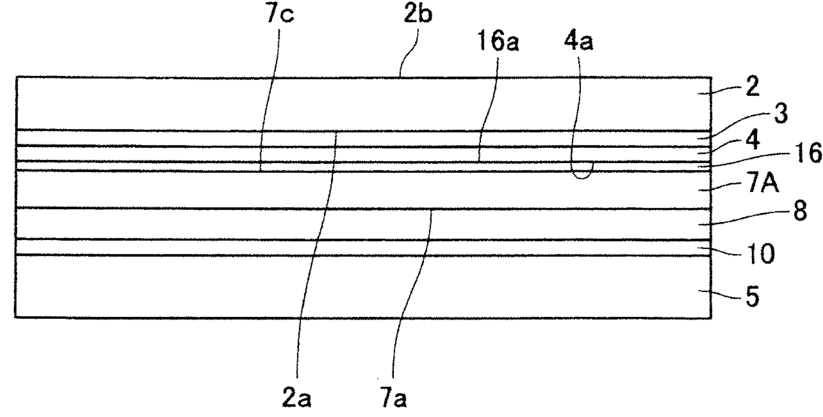
FIG. 4(b)
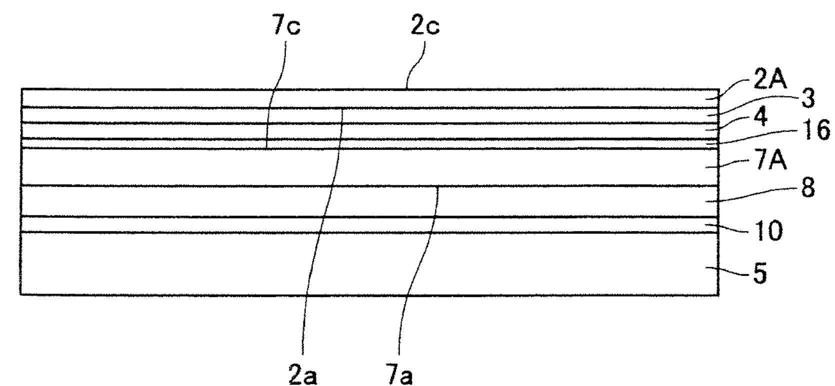
FIG. 4(c)
12
7c
2c
1
2A
3
4
16
7A
8
10
5
2a
7a

PIEZOELECTRIC VIBRATING SUBSTRATE AND PIEZOELECTRIC VIBRATING ELEMENT

CROSS-REFERENCE TO RELATED APPLICATIONS

This is a continuation of PCT/JP2021/000351, filed Jan. 7, 2021, which claims priority to Japanese Application No. JP2020-003003 filed on Jan. 10, 2020, the entire contents of which are hereby incorporated by reference.

TECHNICAL FIELD

The present invention is related to a piezoelectric vibrating substrate and device which can be appropriately used for a MEMS mirror or the like.

BACKGROUND ARTS

A head up display (HUD) is a system for displaying necessary information overlapping in a visual field while line of sight is maintained in forward-looking mode. In the case of driving an automobile, as the information can be visualized while the line of sight is maintained in the forward-looking mode compared with the case that the information on a meter panel or console panel is watched, it is possible to effectively prevent aside driving and further, as a fewer focus shift of eyes is necessary, it is possible to reduce fatigue of a driver and to improve the safety.

It will be described the principle of the HUD. An image from a fluorescent tube, CRT or liquid crystal display is displayed on a front glass or a transparent screen (combiner) of the automobile. Here, the HUD includes the following two systems due to the difference of the optical structures.

(1) Direct Projection system of directly projecting the image on the front glass or the like as a screen.

(2) Virtual Imaging system of imaging the image on the retina of the driver by the front glass or the like as a reflecting mirror.

The major difference between these systems is the feeling of distances when the driver watches the image. According to the Direct Projection system, the image is recognized on the screen (combiner) as a conventional projector. According to the Virtual Imaging system, the image is recognized in a space a few meters away on the line of sight of the driver. According to both systems, the shift of the line of sight is considerably reduced between the forward visual field of the driver and meter panel or console, compared with the case that the HUD is not used. However, according to the Virtual Imaging system, as the focus shift from the visual field during normal driving is made small, the driver can concentrate more on the driving to reduce the fatigue. According to the Virtual Imaging system, it has been promoted the development of a new system of scanning laser beam for the imaging.

According to laser scanning type display, laser beams of three colors RGB are combined through an optical device called a combiner to provide a single beam, which is reflected by a micro mirror to perform the scanning two-dimensionally and the imaging. Although it is similar to electron beam scanning of CRT, instead of exciting a phosphor, the pulse width and output of the respective laser beams are controlled at positions corresponding with the respective pixels on the horizontal scan lines to change the color and brightness so that the pointillism of the pixels is performed at a high speed. Resolution which can be realized is determined by the vibrational frequency of the mirror and modulation frequency of the laser.

Major advantages of the system include the followings.

(1) As a number of parts is low, miniaturization, cost reduction and improvement of reliability can be realized.

(2) As the laser can be illuminated at a brightness required for each pixel, low consumption of electric force can be realized.

(3) As it is used the collimated laser light (parallel light), the adjustment of focus is unnecessary.

The micro mirror is a core part of the laser scanning type display and produced by processing Si by MEMS (Micro Electro Mechanical System) technique and by vapor deposition of a metal. The methods of driving the MEMS mirror may be electrostatic system of driving by electrostatic attraction, electromagnetic system of driving by electromagnetic force, or piezoelectric system of driving by a piezoelectric device. Among them, the advantages of the piezoelectric system include driving at a high speed, lower consumed electric power and large driving force, and the defects include the difficulty of film-formation of the piezoelectric device.

Until now, in the case that a piezoelectric vibrating device included in the MEMS mirror or the like is produced, a piezoelectric film such as PZT is film-formed on a silicon substrate by sputtering or the like

PATENT DOCUMENTS (Patent document 1) Japanese patent publication No. 2014-225596A (Patent document 2) Japanese patent publication No. 2014-086400A

SUMMARY OF THE INVENTION

It is demanded the increase of the display size and angle of view for the HUD until now, and even it is demanded to enlarge the angle of view form conventional 7 to 8 degrees to the maximum of 20 degrees. For realizing the increase of display size and angle of view, it is necessary to improve the frequency, amplitude and reliability of the piezoelectric vibrating element of the MEMS mirror. However, according to the prior piezoelectric vibrating device by forming the piezoelectric layer on the silicon substrate as described in patent document 1, it was proved that a piezoelectric vibrating device having such high-level frequency, amplitude and reliability cannot be realized.

Particularly, in the case that a piezoelectric vibrating device is mounted in a package or on a substrate and subjected to electrical connection, wire bonding or flip tip bonding is performed. During the bonding step, it is necessary to apply heat, ultrasonic vibration and weight on the piezoelectric vibrating device. At this time, if it is applied the specifications for improving the frequency, amplitude and reliability of the piezoelectric vibrating device, it is found that the load of the heating, ultrasonic vibration and weight becomes considerable so that cracks or tipping tend to be generated in the piezoelectric vibrating device. The yield of the piezoelectric vibrating device is thereby lowered.

An object of the present invention is to suppress cracks or tipping due to heating, ultrasonic vibration and weight applied when a piezoelectric vibrating device is mounted.

A first aspect of the present invention provides a piezoelectric vibrating substrate comprising:

a piezoelectric layer comprising a bulk piezoelectric material and having a first surface and a second surface on a opposite side of the first surface;

a lower electrode on said first surface of said piezoelectric layer; and a supporting substrate bonded to said lower electrode.

Further, the present invention provides a piezoelectric vibrating device comprising:

said piezoelectric vibrating substrate; and an upper electrode on said piezoelectric layer.

A second aspect of the present invention provides a piezoelectric vibrating substrate comprising:

a piezoelectric layer comprising a bulk piezoelectric material and having a first surface and a second surface on a opposite side of the first surface;

a lower electrode on said first surface of said piezoelectric layer;

a high-rigidity ceramic plate bonded with said lower electrode; and a supporting substrate bonded with said high-rigidity ceramic plate.

Further, the present invention provides a piezoelectric vibrating device comprising:

said piezoelectric vibrating substrate; and an upper electrode on said second surface of said piezoelectric layer.

The inventors researched the reason that the cracks or tipping are generated in a piezoelectric vibrating device due to heating, ultrasonic vibration and weight when the piezoelectric vibrating device is mounted in a package or on a substrate for the electrical connection. As a result, in the case that a piezoelectric film such as PZT is film-formed by various kinds of film-formation methods such as sputtering, it is found that the crystalline quality of the piezoelectric film is inferior providing the cause of the cracks or tipping.

Thus, the present inventors investigated to produce a piezoelectric vibrating plate by thinning a bulk piezoelectric material substrate. However, such bulk piezoelectric material substrate is susceptible to cracks due to deficiency of the strength in the case that it is thinned by processing to a thickness of, for example, 50 μm or smaller. It is thus difficult to apply for the piezoelectric vibrating device.

Based on such findings, the present inventors tried to directly bond a bulk piezoelectric material substrate onto a separate supporting substrate through a lower electrode and intermediate layer and to thin the piezoelectric material substrate to a desirable thickness suitable for the vibration at a high frequency, so that it can be successfully formed a piezoelectric vibrating layer having a small thickness and good crystallinity. It is thus possible to suppress the cracks or tipping of the piezoelectric vibrating device due to the heat, ultrasonic vibration and weight.

In the piezoelectric vibrating substrate of such embodiment, the present inventors found that the cracks or tipping of the piezoelectric vibrating device due to the heat, ultrasonic vibration and weight can be further reduced, by providing a separate high-rigidity ceramic plate between the lower electrode provided on the first surface of the piezoelectric layer and supporting substrate.

As a result, according to the present invention, it is possible to realize a piezoelectric actuator device excellent in the piezoelectric performance and durability.

BRIEF DESCRIPTION OF THE DRAWINGS

FIG. 4(*a*) shows a bonded body of the supporting substrate 5, lower electrode 3, high-rigidity ceramic plate 7A and piezoelectric body 2, FIG. 4(*b*) shows the state that the piezoelectric body 2 in the bonded body of FIG. 4(*a*) is proceed to provide a piezoelectric layer 2A, and FIG. 4(*c*) shows a piezoelectric vibrating device 12.

MODES FOR CARRYING OUT THE INVENTION

Figure 1A:
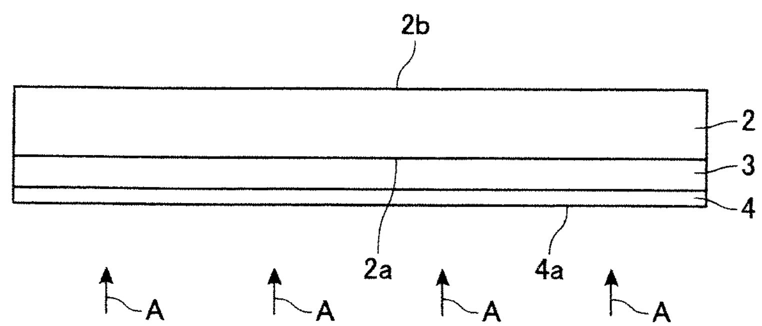
FIG. 1(*a*) shows a laminated body of a piezoelectric body 2, lower electrode 3 and intermediate layer 4, FIG. 1(*b*) shows a supporting substrate 5, and FIG. 1(*c*) shows a bonded body of the intermediate layer 4 and supporting substrate 5 directly bonded with each other.

The present invention will be described further in detail below, appropriately referring to the drawings.

Figure 1B:
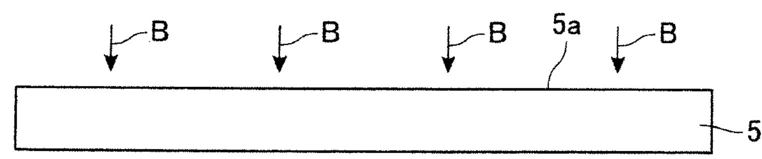
Figure 1C:
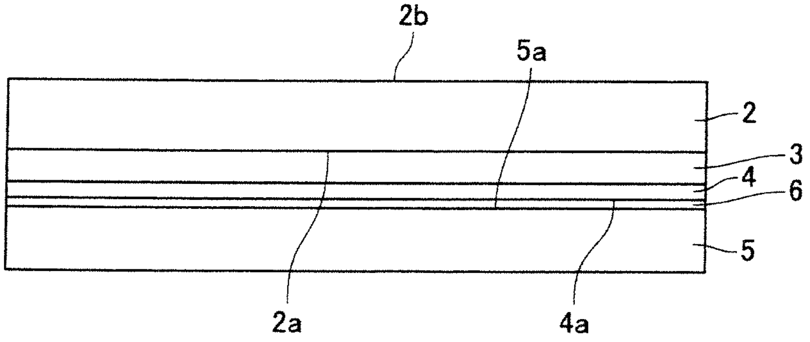
Figure 2A:
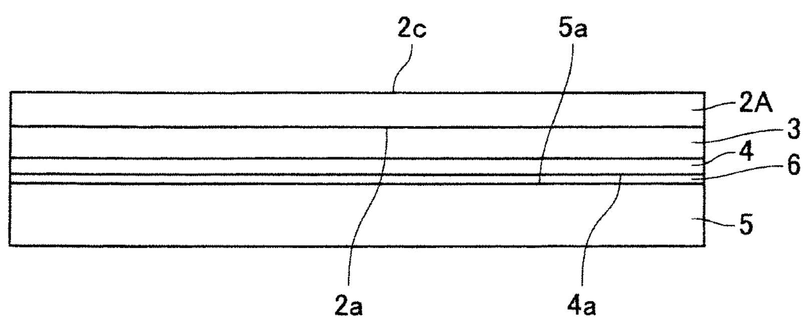
FIG. 2(*a*) shows a bonded body obtained by processing the piezoelectric body in the bonded body of FIG. 1(*c*), and FIG. 2(*b*) shows a piezoelectric vibrating device 11 including a piezoelectric vibrating layer 2A, an upper electrode 1, a lower electrode 3, the intermediate layer 4, an amorphous layer 6 and the supporting substrate 5.
Figure 2B:
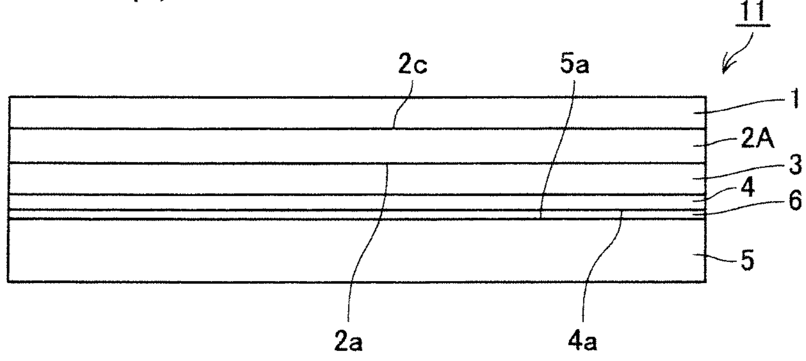

FIGS. 1 and 2 relate to the invention of the first aspect.

According to a preferred embodiment, as shown in FIG. 1(*a*), a piezoelectric body 2 has a first surface 2*a* and second surface 2*b*. A lower electrode 3 and intermediate layer 4 are provided on the first surface 2*a* of the piezoelectric body 2. Then, neutralized atomic beam is irradiated onto a bonding surface 4*a* of the intermediate layer 4 as an arrow A to activate the bonding surface 4*a*.

Further, as shown in FIG. 1(*b*), neutralized atomic beam is irradiated onto a bonding surface 5*a* of the supporting substrate 5 as an arrow B to activate the bonding surface 5*a*. Then, as shown in FIG. 1(*c*), the bonding surface 4*a* of the intermediate layer 4 and bonding face 5*a* of the supporting substrate 5 are contacted and directly bonded with each other to provide a bonded body. Typically, an amorphous layer 6 is generated along an interface between the supporting substrate 5 and intermediate layer 4.

Then, as shown in FIG. 2(*a*), the piezoelectric body of the bonded body is processed and thinned to form a piezoelectric layer 2A having a desired thickness. The thickness of the piezoelectric layer 2A is appropriately changed, depending on a target vibrational frequency. 2*c* represents a processed surface (second surface) of the piezoelectric layer 2A. Then, as shown in FIG. 2(*b*), an upper electrode 1 is formed on the second surface 2*c* of the piezoelectric layer 2A to obtain a piezoelectric vibrating device 11.

Figures 3A, 3B, 3C, 3D:
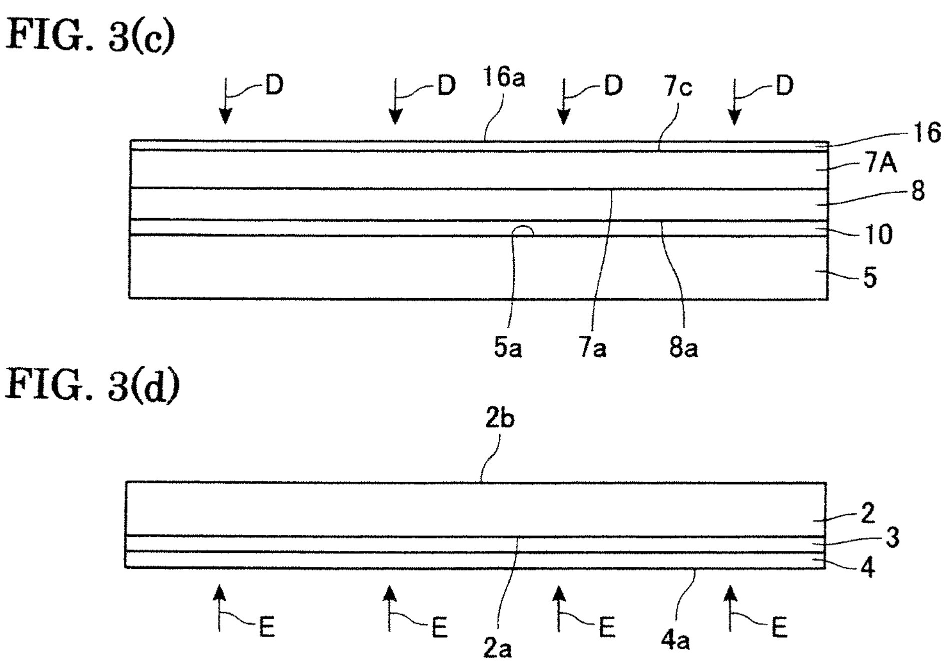
FIG. 3(*a*) shows the state that an intermediate layer 8 is provided on a first surface of a high-rigidity ceramic body 7, FIG. 3(*b*) shows a supporting substrate 5, FIG. 3(*c*) shows the state that a high-rigidity ceramic plate 7A is bonded with the supporting substrate 5, and FIG. 3(*d*) shows the state that a lower electrode 3 and intermediate layer 4 are provided on the piezoelectric body 2.

FIGS. 3 and 4 relates to the second aspect of the invention.

As shown in FIG. 3(*a*), a high-rigidity ceramic body 7 has a first surface 7*a* and second surface 7*b*. An intermediate layer 8 is provided on the first surface 7*a* of the high-rigidity ceramic body 7. Then, neutralized atomic beam is irradiated onto a bonding surface 8*a* of the intermediate layer 8 as arrows C to activate the bonding surface 8*a*. Further, as shown in FIG. 3(*b*), neutralized atomic beam is irradiated onto the bonding surface 5*a* of the supporting substrate 5 as arrows B to activate the bonding surface 5*a*.

Then, as shown in FIG. 3(*c*), the bonding surface 8*a* of the intermediate layer 8 and bonding layer 5*a* of the supporting substrate 5 were contacted and directly bonded with each other to obtain a bonded body. At this time, typically, an amorphous layer 10 is generated along an interface between the bonding surface 8*a* and bonding surface 5*a*.

Then, the high-rigidity ceramic body 7 is processed and thinned to form a high-rigidity ceramic plate 7A having a desired thickness. Then, an intermediate layer 16 is provided on a second surface 7*c* of the high-rigidity ceramic plate 7A and neutralized atomic beam is irradiated onto a bonding surface 16*a* of the intermediate layer as arrows D to perform the surface activation.

Further, as shown in FIG. 3(*d*), a lower electrode 3 and intermediate layer 4 are sequentially provided on the first surface 2*a* of the piezoelectric body 2 and the bonding surface 4*a* of the intermediate layer 4 is activated by neutralized atomic beam E. Then, as shown in FIG. 4(*a*), the bonding surface 4*a* of the intermediate layer 4 and the intermediate layer 16 on the second surface 7*c* of the high-rigidity ceramic plate 7A are contacted and directly bonded with each other to obtain a bonded body. At this time, typically, an amorphous layer is generated along an interface between the directly bonded intermediate layer 4 and intermediate layer 16.

Then, as shown in FIG. 4(*b*), the piezoelectric body 2 of the bonded body is processed and thinned to form a piezoelectric layer 2A having a desired thickness. The thickness of the piezoelectric layer 2A is appropriately changed depending on a target vibrational frequency. 2*c* represents a processed surface (second surface) of the piezoelectric layer 2A. Then, as shown in FIG. 4(*c*), an upper electrode 1 is formed on the second surface 2*c* of the piezoelectric layer 2A to obtain a piezoelectric vibrating device 12.

The device of the present invention is composed of a bulk piezoelectric material and includes a piezoelectric layer having a first surface and a second surface.

The bulk piezoelectric material does not mean a piezoelectric material in a state formed on a substrate as a film and means a piezoelectric material formed as a bulk by a crystal growth method or sintering method. Such piezoelectric material usually has good crystallinity and high strength.

Particularly, as the crystallinity of the bulk piezoelectric material is good, it is obtained the characteristics that $d_{3\ 1}$ (elongation and contraction along the direction of the electrode surface), one of piezoelectric properties required for devices, is larger than that of a film-formed article. Even in the case that the piezoelectric constant ($d_{3\ 1}$:pc/N=pm/V) of a bulk article is 150 or higher (it may exceed 200), for example, that of the film-formed article is 150 or lower and may be around 100 in average in many cases.

Although the piezoelectric material is not particularly limited, lead-based perovskite oxide (for example, lead titanate zirconate (PZT) and lead magnesium niobate-lead titanate (PMN-PT) are exemplified. Further, La (lanthanum), Nb (niobium) and/or Sr (strontium) may be added into the lead-based perovskite oxide (for example, PZT), or an oxide such as $Pb(Mg, Nb)O_3$, $Pb(Ni, Nb)O_3$, $PbTiO_3$ or the like or the combination thereof may be applied.

The thickness of the piezoelectric body before the processing may preferably be 200 μm or larger, on the viewpoint of the mechanical strength during the handling. Further, the piezoelectric layer (vibrating body) after the processing is decided depending on a target vibrational frequency and may be 0.5 μm to 50 μm, for example.

The materials of the upper electrode and lower electrode are not particularly limited, and it may be applied as far as a voltage controlling the vibration of the piezoelectric layer can be applied. For example, platinum, gold, Au—Cu, Al and an Al—Cu alloy are exemplified. For example, a buffer layer such as Cr, Ti or the like, for improving the adhesion of respective electrodes, may be provided between the piezoelectric layer and upper electrode or between the high-rigidity ceramic plate and lower electrode.

In the case that the piezoelectric body such as PZT or the like is formed on the supporting substrate by film-forming method, it is required a seed layer for growing the piezoelectric body on the supporting substrate. On the viewpoint of growing the piezoelectric body, Pt is generally applied as a material of the seed layer. Thus, there was no alternative other than Pt as the lower electrode according to the film-forming method.

Further, according to the present invention, as a vibrating body is produced by bonding the bulk piezoelectric material onto the supporting substrate, it is possible to bong the lower electrode onto the piezoelectric body without being influenced by the material and film thickness of the lower electrode. It is thereby possible to select the electrode material best suited for a device and process. For example, as Au can be easily etched compared with Pt, it is possible to realize finer lower electrode. Generally, as the lower electrode is made finer, the wiring resistance is increased to result in problematic deterioration of device characteristics or deterioration of reliability due to heat generation. As the resistance of Au is lower than that of Pt, the problems due to the increase of the wiring resistance can be avoided in the case that the electrode is made finer. Thus, the miniaturization and improved performance of the device can be realized at the same time.

On such viewpoint, although Au is particularly preferred as the material of the lower electrode, Ag, Cu, Al, W and Mo may preferably be applied, and the alloys of Au, Ag, Cu, Al, W and Mo may be preferably applied. Further, the buffer layer described above may preferably be provided between the lower electrode and piezoelectric body to improve the adhesion.

According to the invention of the first aspect, an intermediate layer may be provided on the lower electrode, or the intermediate layer may be provided on the supporting substrate. The direct bonding includes the following embodiments.

(1) The intermediate layer on the lower electrode and supporting substrate are directly bonded.

(2) The intermediate layer on the supporting substrate and lower electrode are directly bonded.

(3) The intermediate layer on the lower electrode and intermediate layer on the supporting substrate are directly bonded.

Further, according to the invention of the second aspect, the intermediate layer may be provided on the bonding surface of the lower electrode, or the intermediate layer may be provided on the first surface of the high-rigidity ceramic plate. The direct bonding includes the following embodiments.

(1) The intermediate layer on the bonding surface of the lower electrode and the second surface of the high-rigidity ceramic plate are directly bonded.
(2) The intermediate layer on the second surface of the high-rigidity ceramic plate and the bonding surface of the lower electrode are directly bonded.
(3) The intermediate layer on the bonding surface of the lower electrode and the intermediate layer on the second surface of the high-rigidity ceramic plate are directly bonded.

Further, according to the invention of the second aspect, the intermediate layer may be provided on the bonding surface of the supporting substrate, or the intermediate layer may be provided on the first surface of the high-rigidity ceramic body. The direct bonding includes the following embodiments.

(1) The intermediate layer on the bonding surface of the supporting substrate and the first surface of the high-rigidity ceramic body are directly bonded.
(2) The intermediate layer of the first layer of the high-rigidity ceramic plate and the bonding surface of the supporting substrate are directly bonded.
(3) The intermediate layer on the first surface of the high-rigidity ceramic plate and intermediate layer on the bonding surface of the supporting substrate are directly bonded.

According to each of the embodiments, an amorphous layer may be generated along the interface of the direct bonding.

Such intermediate layer is preferred for improving the bonding strength of the lower electrode and high-rigidity ceramic plate and of the high-rigidity ceramic plate and supporting substrate.

Although the material of the intermediate layer is not limited, silicon oxide, tantalum pentoxide, titanium oxide, zirconium oxide, hafnium oxide, niobium oxide, bismuth oxide, alumina, magnesium oxide, aluminum oxide, silicon nitride and silicon are exemplified.

Although the thickness of the intermediate layer is not particularly limited, it may preferably be 0.01 to 1 μm and more preferably be 0.01 to 0.5 μm, on the viewpoint of the production cost.

Although the method of film formation of the intermediate layer is not particularly limited, sputtering method, chemical vapor deposition (CVD) and vapor deposition are exemplified.

Although the material of the supporting substrate is not particularly limited, a metal oxide, aluminum nitride, silicon carbide, silicon, a glass, a metal and SOI (Silicon on Insulator) are preferred. Such metal oxide may be an oxide of a single metal or a composite oxide of a plurality kinds of metals. Such metal oxide may preferably be selected from the group consisting of sialon, sapphire, cordierite, mullite and alumina. Alumina may preferably be translucent alumina. SUS, copper, aluminum or the like may be listed as the metal.

The relative density of the supporting substrate may preferably be 95.5% or higher and may be 100%, on the viewpoint of the bonding strength. The relative density is measured by Arkimedes method. Further, although the production method of the supporting substrate is not particularly limited, sintered body and crystal growth are preferred.

High-rigidity ceramics forming the high-rigidity ceramic plate means a material having a Young's Modulus (JIS R1602) of 200 GPa or higher, a bending strength (JIS R1601) of 310 MPa or higher, and a fracture toughness (JIS R1607) of 1.5 MPa√m or larger.

The kinds of the high-rigidity ceramics include sialon, translucent alumina, sapphire and the like.

Sialon is a ceramic obtained by sintering mixture of silicon nitride and alumina, and has the following composition.

$$Si_{6-z}Al_zO_zN_{8-z}$$

That is, sialon has the composition in which alumina is mixed into silicon nitride, and z indicates the mixed ratio of alumina. Z may preferably be 0.5 or higher. Further, z may more preferably be 4.0 or lower.

Sapphire is a single crystal having a composition of $Al_2O_3$, and alumina is a polycrystal having a composition of $Al_2O_3$.

In the case that the intermediate layer and supporting substrate, intermediate layer and lower electrode, the intermediate layer and high-rigidity ceramic body, intermediate layer and supporting substrate, or the intermediate layers are directly bonded, respectively, the following methods are preferred.

First, the bonding surfaces of the respective intermediate layers, bonding layer of the supporting substrate, the bonding surface of the high-rigidity ceramic body, and the bonding surface of the lower electrode are flattened to obtain the respective flat surfaces. Here, the method of flatten the respective bonding surfaces may be lapping, chemical mechanical polishing (CMP) or the like. Further, the arithmetic average roughness Ra of the flat surface may 1 nm or lower and more preferably be 0.3 nm or lower.

Then, the respective bonding surfaces are cleaned for removing the residue of a polishing agent or processing-denatured layer. The method of cleaning the respective bonding surfaces may be wet cleaning, dry cleaning, scrub cleaning or the like, and the scrub cleaning is preferred for obtaining clean surface simply and efficiently. In this case, after Sun Wash LH540 is applied as the cleaning agent, it is preferred to perform the cleaning by means of a scrub cleaning machine by applying mixed solution of acetone and IPA (isopropyl alcohol).

Then, neutralized atomic beam is irradiated onto the respective bonding surfaces to activate the respective surfaces.

When the activation of the surfaces is performed by the neutralized beam, it is preferred to use a system described in Patent document 2 to generate the neutralized beam, which is irradiated. That is, a high-speed atomic beam source of saddle field type is used as the beam source. Then, an inert gas is introduced into a chamber and a high voltage is applied onto electrodes from a direct current electric source. By this, an electric field of a saddle field type generated between the electrode (positive electrode) and a housing (negative electrode) causes the motion of electrons, e, so that atomic and ion beams derived from the inert gas are generated. Among the beams reached at a grid, the ion beam is neutralized at the grid, and the beam of neutral atoms is emitted from the high-speed atomic beam source. The atomic specie for the beams may preferably be an inert gas (argon, nitrogen or the like).

In the activation step by beam irradiation, the voltage may preferably be made 0.5 to 2.0 kV, and the current may preferably be made 50 to 200 mA.

Then, the activated surfaces are contacted and bonded with each other under vacuum atmosphere. The temperature at this time is ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

An amorphous layer may be generated between the supporting substrate and intermediate layer. The composition of such amorphous layer contains a metal element constituting the intermediate layer, a metal element constituting the supporting substrate, oxygen element or nitrogen element constituting the supporting substrate and optionally argon.

Further, an amorphous layer may be generated between the lower electrode and intermediate layer. The composition of such amorphous layer contains a metal element constituting the intermediate layer, a metal element constituting the lower electrode, and optionally argon.

Further, an amorphous layer may be generated between the high-rigidity ceramic plate and intermediate layer. The composition of such amorphous layer contains a metal element constituting the intermediate layer, a metal element constituting the high-rigidity ceramic plate, oxygen element or nitrogen element constituting the high-rigidity ceramic plate and optionally argon.

Further, an amorphous layer may be generated between the piezoelectric body and intermediate layer. The composition of such amorphous layer contains a metal element constituting the intermediate layer, a metal element constituting the piezoelectric body, and optionally argon.

According to a preferred embodiment, when the substrate of the first aspect is produced, the lower electrode and intermediate layer are provided on the piezoelectric body, and the bonding surface of the intermediate layer and bonding surface of the supporting substrate are directly bonded to obtain a bonded body. In this case, typically, an amorphous layer is generated along an interface between the supporting substrate and intermediate layer.

Then, the piezoelectric body of the bonded body is processed and thinned to form the piezoelectric layer having a desired thickness to obtain the piezoelectric vibrating substrate. Then, as shown in FIG. 2(*b*), the upper electrode is formed on the second surface of the piezoelectric layer to obtain the piezoelectric vibrating device.

Further, for producing the substrate of the second aspect, the intermediate layer is provided on the first surface of the high-rigidity ceramic body. Then, the intermediate layer and bonding surface of the supporting substrate are directly bonded to obtain the bonded body. At this time, typically, an amorphous layer is generated along the interface between the intermediate layer and bonding surface of the supporting substrate. Then, the high-rigidity ceramic body is processed and thinned to form the high-rigidity ceramic plate having a desired thickness.

Further, the lower electrode is provided on the first surface of the piezoelectric body and intermediate layer is provided on the bonding surface of the lower electrode.

Then, the intermediate layer is provided on the second surface of the high-rigidity ceramic plate, and the intermediate layer is directly bonded to the intermediate layer on the bonding surface of the lower electrode. Then, the piezoelectric body is processed to obtain the piezoelectric layer.

The piezoelectric vibrating device of the present invention can be appropriately applied for an actuator of a MEMS device or the like.

EXAMPLES

Inventive Example A1

The piezoelectric vibrating device 11 shown in FIG. 2(*b*) was fabricated, according to the method described referring to FIGS. 1 and 2.

However, the piezoelectric body 2 was composed of a bulk body of PZT having a thickness of 250 μm, and the materials of the upper electrode 1 and lower electrode 3 were made Pt. The intermediate layer 4 composed of amorphous silicon was provided by sputtering method on the lower electrode 3. Further, it was prepared the supporting substrate 5 composed of silicon. Then, the bonding surface 5*a* of the supporting substrate 5 and bonding surface 4*a* of the intermediate layer 4 were finished by chemical mechanical processing (CMP) so that the respective arithmetic average roughnesses Ra were made 0.2 nm.

Then, the bonding surface 5*a* of the supporting substrate 5 and bonding surface 4*a* of the intermediate layer 4 were cleaned to remove the contamination, followed by the introduction into a vacuum chamber. After it was subjected to vacuum evacuation to the order of $10^{-6}$ Pa, high-speed atomic beam (acceleration voltage of 1 kV and Ar flow rate of 27 sccm) was irradiated onto each of the bonding surfaces 4*a* and 5*a* over 120 sec. Then, after the bonding surface 5*a* of the supporting substrate 5 and bonding surface 4*a* of the intermediate layer 4 were contacted, they were subjected to the bonding by pressurization at 10000N over 2 minutes.

Then, the one main surface 2*b* of the piezoelectric body 2 was subjected to grinding and polishing to form the piezoelectric layer 2A having a thickness of 1 μm. Then, the upper electrode 1 was film-formed on the second surface 2*c* of the piezoelectric layer 2A by sputtering method to obtain the piezoelectric vibrating device 11.

The piezoelectric vibrating device 11 was mounted in a package and wire bonding was then performed. During the bonding step, heating (150° C.), ultrasonic vibration (80 kHz) and weight (500 gf) were applied on the piezoelectric vibrating device 11. As a result, the ratio of defective articles, in which cracks or tipping were generated in the piezoelectric vibrating device 11, was proved to be 5%.

Figure 5:
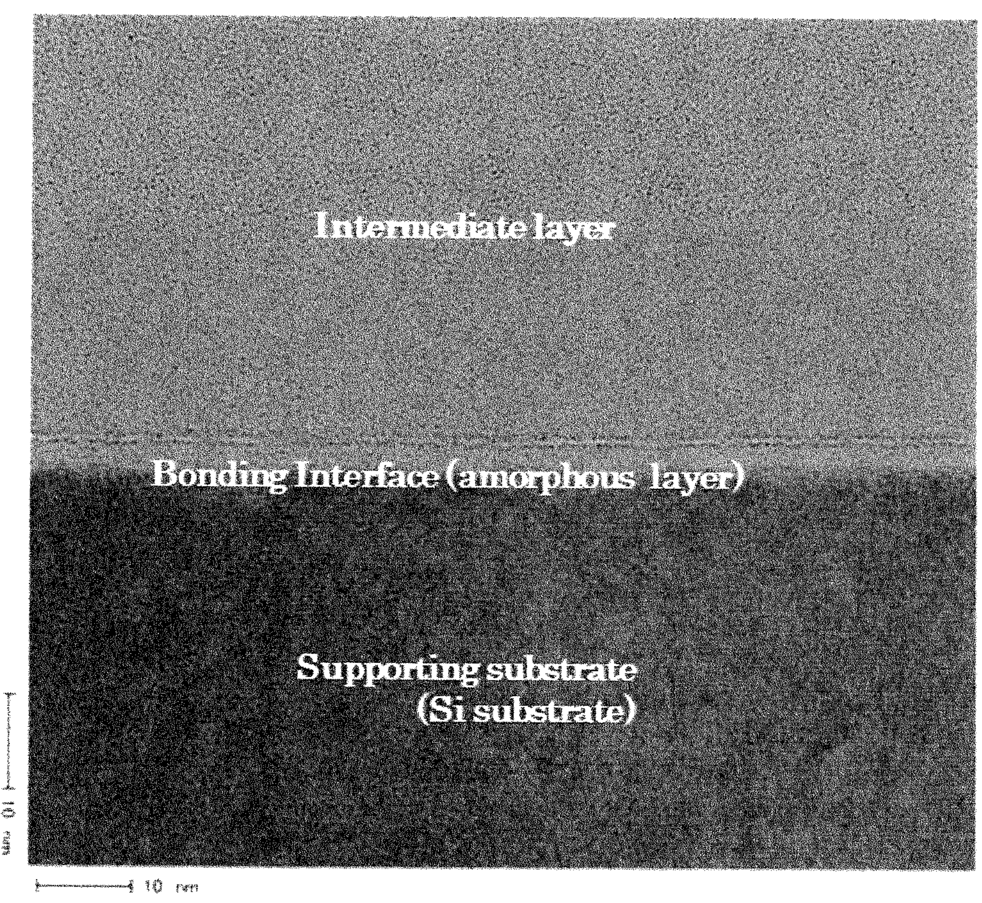
FIG. 5 is a photograph taken by a transmission type electron microscope (TEM) of the vicinity of an interface between the supporting substrate and intermediate layer according to the inventive example.

FIG. 5 is a photograph (magnification of 2,000,000 folds) of a cross section showing the bonding interface and the vicinity of the intermediate layer and supporting substrate of the piezoelectric vibrating device 11, taken by a transmission type electron microscope (TEM). In FIG. 5, a brighter region on the upper side corresponds with the intermediate layer (amorphous silicon), the lower side corresponds with the supporting substrate (silicon), and a band-shaped region on the central part corresponds with the amorphous layer generated during the bonding. The ratios of the respective atoms in the supporting substrate, amorphous layer and intermediate layer were as follows.

TABLE 1

| Unit of composition (atm %) | Si | O | Ar |
|---|---|---|---|
| Intermediate layer (α-Si film) | 93.6 | 6.4 | 0.0 |
| Bonding interface (Amorphous layer) | 93.3 | 5.0 | 1.7 |
| Supporting substrate (Si substrate) | 98.8 | 1.2 | 0.0 |

Comparative Example A1

A piezoelectric layer was film-formed by vapor phase film-forming method to fabricate a piezoelectric vibrating device.

That is, a lower electrode 3 composed of Pt, and the piezoelectric layer composed of PZT and having a thickness of 1 μm were film-formed by sputtering on a supporting substrate of silicon, to obtain the piezoelectric vibrating device.

Then, the piezoelectric vibrating device was mounted in a package, and the heat, ultrasonic vibration and weight were applied according to the same procedure as that of the inventive example A1. As a result, the ratio of occurrence of defective articles, in which cracks or tipping were generated in the piezoelectric vibrating device, was proved to be 20%.

Inventive Example B1

The piezoelectric vibrating device 11 was fabricated according to the same procedure as that of the inventive example A1. However, different from the inventive example A1, the materials of the piezoelectric body 2 and piezoelectric layer 2A were made PMN-PT, and the other procedure were made same as that of the inventive example A1. The thus obtained piezoelectric vibrating device 11 was mounted in a package and the heat, ultrasonic vibration and weight were applied according to the same procedure as that of the inventive example A1. As a result, the ratio of occurrence of defective articles, in which cracks or tipping were generated in the piezoelectric vibrating device, was proved to be 6%.

Comparative Example B1

The piezoelectric vibrating device 11 was fabricated according to the same procedure as that of the comparative example A1. However, different from the comparative example A1, the material of the piezoelectric layer was made PMN-PT. The other procedure was made same as that of the comparative example A1. The thus obtained piezoelectric vibrating device was mounted in a package, and the heat, ultrasonic vibration and weight were applied according to the same procedure as that of the inventive example A1. As a result, the ratio of occurrence of defective articles, in which cracks or tipping were generated in the piezoelectric vibrating device, was proved to be 22%.

Inventive Example C1

The piezoelectric vibrating device 12 shown in FIG. 4(*c*) was fabricated, according to the method described referring to FIGS. 3 and 4.

However, as shown in FIG. 3(*a*), the intermediate layer 8 composed of amorphous silicon was provided on the first surface 7*a* of the high-rigidity ceramic body 7 composed of sialon and having a thickness of 250 μm. Further, as shown in FIG. 3(*b*), the intermediate layer composed of amorphous silicon was prepared on the surface of the supporting substrate 5 composed of silicon and having a thickness of 500 μm. Then, the bonding surface 5*a* of the intermediate layer on the supporting substrate and bonding layer 8*a* of the intermediate layer 8 were finished by chemical mechanical polishing (CMP) so that the respective arithmetic roughnesses Ra were made 0.2 nm.

Then, the bonding surface 5*a* of the intermediate layer on the supporting substrate 5 and bonding surface 8*a* of the intermediate layer 8 were cleaned to remove the contamination, followed by the introduction into the vacuum chamber. After it was subjected to vacuum evacuation to the order of $10^{-6}$ Pa, high-speed atomic beam (acceleration voltage of 1 kV and Ar flow rate of 27 sccm) was irradiated onto each of the bonding surfaces 5*a* and 8*a* over 120 sec. Then, after the bonding surface 5*a* of the intermediate layer on the supporting substrate 5 and bonding layer 8*a* of the intermediate layer 8 were contacted, they were subjected to the bonding by pressurization at 10000N over 2 minutes. Then, the thus obtained bonded body was heated at 100° C. for 20 hours.

Then, the second surface 7*b* of the high-rigidity ceramic body 7 was subjected to grinding and polishing, to form the high-rigidity ceramic plate 7A having a thickness of 50 μm, as shown in FIG. 3(*c*). However, according to the present inventive example, the intermediate layer 16 was not provided on the second surface 7*c* of the high-rigidity ceramic plate 7A.

Further, as shown in FIG. 3(*d*), the piezoelectric body 2 was composed of a bulk body of PZT having a thickness of 250 μm, Ti (15 nm)/Pt (200 nm) was film-formed on the first surface 2*a* of the piezoelectric body 2 as the lower electrode 3, and the intermediate layer 4 composed of amorphous silicon was provided by sputtering.

Then, the second surface 7*c* of the high-rigidity ceramic plate 7A and bonding surface 4*a* of the intermediate layer 4 (refer to FIG. 1(*a*)) were finished by chemical mechanical polishing (CMP) so that the respective arithmetic average roughnesses Ra were made 0.2 nm.

Then, the second surface 7*c* of the high-rigidity ceramic plate 7A and bonding surface 4*a* of the intermediate layer 4 were cleaned to remove the contamination, followed by the introduction into the vacuum chamber. It was subjected to vacuum evacuation to the order of $10^{-6}$ Pa, high-speed atomic beam (acceleration voltage of 1 kV and Ar flow rate of 27 sccm) was irradiated onto each of the second surface 7*c* and bonding surface 4*a* over 120 seconds. Then, after the second surface 7*c* of the high-rigidity ceramic plate 7A and bonding surface 4*a* of the intermediate layer 4 were contacted, they were subjected to bonding by pressuring at 10000N over 2 minutes. Then, the thus obtained bonded body was heated at 100° C. over 20 hours.

Then, the second surface 2*b* of the piezoelectric body 2 was subjected to grinding and polishing, to form the piezoelectric layer 2A having a thickness of 1 μm, as shown in FIG. 4(*b*). Then, the upper electrode (Ti (15 nm)/Pt (200 nm)) was film-formed by sputtering to obtain the piezoelectric vibrating device 12.

The piezoelectric vibrating device 12 was mounted in a package and the wire bonding was performed. During the bonding step, heating (150° C.), ultrasonic vibration (80 kHz) and weight (500 gf) were applied on the piezoelectric vibrating device 12. As a result, the ratio of occurrence of defective articles, in which cracks or tipping were generated in the piezoelectric vibrating device 11, was proved to be 5%.

Figure 6:
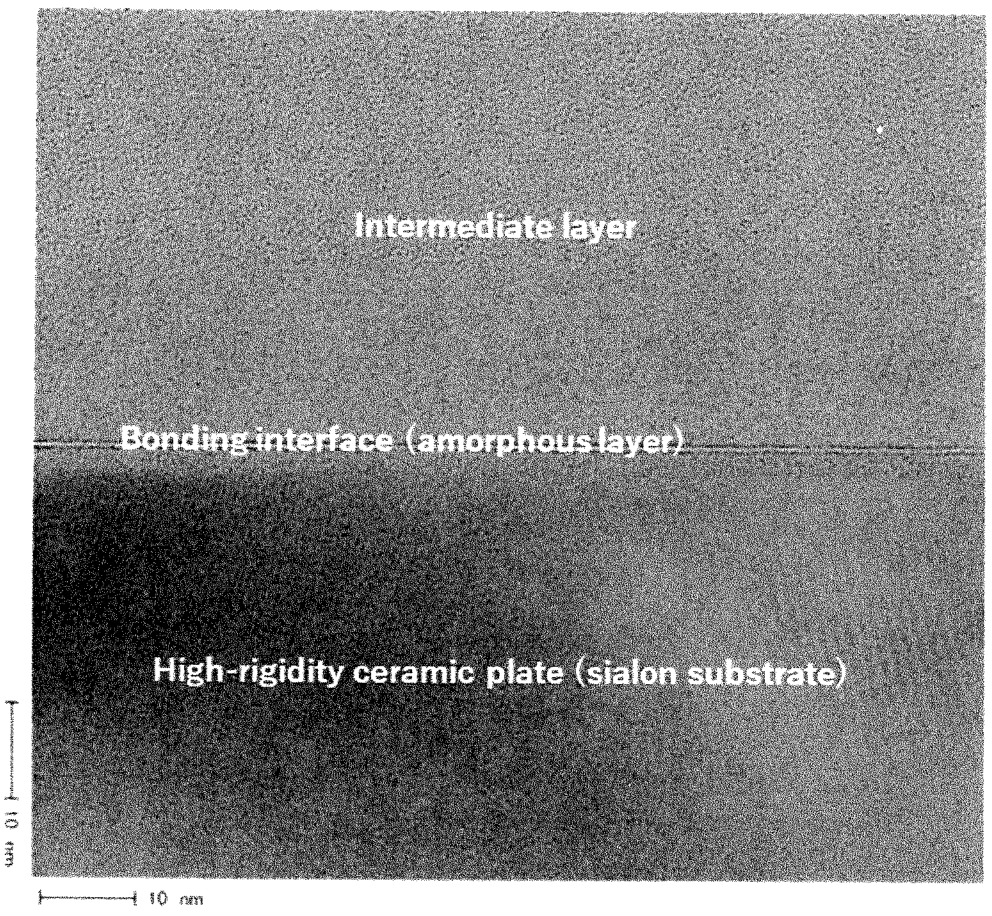
FIG. 6 is a photograph taken by a transmission type electron microscope (TEM) of a cross section showing a bonding interface, and the vicinity, of the intermediate layer on the bonding surface of the lower electrode and high-rigidity ceramic plate according to the inventive example.

FIG. 6 is a photograph (magnification of 2,000,000 folds) showing a cross section of the bonding interface, and the vicinity, of the intermediate layer on the bonding surface of the lower electrode 3 and high-rigidity ceramic plate, taken by a transmission type electron microscope (TEM). In FIG. 6, the brighter region on the upper side corresponds with the intermediate layer (amorphous silicon), the lower side corresponds with the high-rigidity ceramic plate (sialon), and the band-shaped region in the central part corresponds with the amorphous layer generated during the bonding. The ratios of the respective atoms in the high-rigidity ceramic plate, amorphous layer and intermediate layer were as follows.

TABLE 2

| Unit of composition (atm %) | Si | O | Ar | Al | N |
|---|---|---|---|---|---|
| Intermediate layer (α-Si) | 91.2 | 6.4 | 0.4 | 0.4 | 1.5 |
| Bonding interface (Amorphous layer) | 29.2 | 24.2 | 4.2 | 21.7 | 20.7 |
| High-rigidity ceramic plate (Sialon) | 30.0 | 21.7 | 0.0 | 24.8 | 23.4 |

Figure 7:
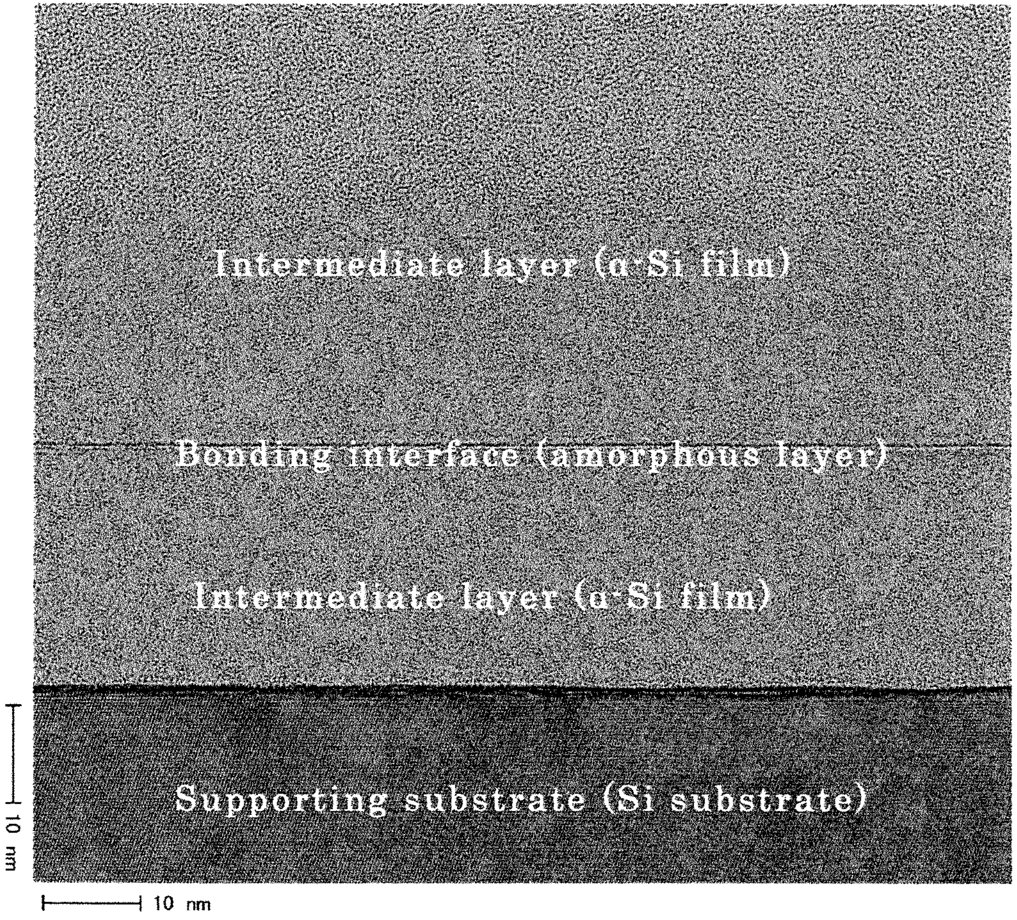
FIG. 7 is a photograph taken by a transmission type electron microscope (TEM) of a cross section of a bonding interface, and the vicinity, of the intermediate layer on the bonding surface of the supporting substrate and high-rigidity ceramic plate.

FIG. 7 is a photograph (magnification of 2,000,000 folds) of a cross section showing the bonding interface, and the vicinity, of the intermediate layer on the bonding surface 5*a* of the supporting substrate 5 and the intermediate layer on the first surface of the high-rigidity ceramic plate, taken by a transmission type electron microscope (TEM). In FIG. 7, the brighter region on the upper side corresponds with the intermediate layer (amorphous layer), and the darker region on the lower side corresponds with the supporting substrate (silicon).

Then, the band-shaped region between the two intermediate layers corresponds with the amorphous layer generated during the bonding. The ratios of the respective atoms in the intermediate layer on the high-rigidity ceramic plate, amorphous layer on the first surface, intermediate layer on the supporting substrate and supporting substrate were as follows.

TABLE 3

| Unit of composition (atm %) | Si | O | Ar |
|---|---|---|---|
| Intermediate layer (α-Si) on first surface of high-rigidity ceramic plate | 92.2 | 7.4 | 0.5 |
| Bonding interface (amorphous layer) | 89.8 | 8.1 | 2.1 |
| Intermediate layer (α-Si) on bonding surface of supporting substrate | 94.5 | 4.9 | 0.6 |
| Supporting substrate (Si substrate) | 98.6 | 1.4 | 0.0 |

Inventive Example D1

The piezoelectric vibrating device was fabricated according to the same procedure as that of the inventive example A1.

However, different from the inventive example A1, the material of the buffer layer on the piezoelectric body was made Cr, and the materials of the lower electrode and upper electrode were made Au. Further, the intermediate layer was not provided on the lower electrode, the intermediate layer was not provided on the supporting substrate, and the lower electrode and supporting substrate were directly bonded.

Specifically, the piezoelectric body 2 was made of a bulk body of PZT having a thickness of 250 μm, and the buffer layer and lower electrode were film-formed on the piezoelectric body 2 by sputtering. The material of the buffer layer was made Cr, and the material of the lower electrode was made Au. Further, the supporting substrate 5 made of silicon was prepared. Then, the bonding surface 5*a* of the supporting substrate 5 and bonding surface of the lower electrode were finished by chemical mechanical polishing (CMP) so that the respective arithmetic average roughnesses Ra were made 0.2 nm.

Then, the bonding surface 5*a* of the supporting substrate 5 and bonding surface of the lower electrode were cleaned to remove the contamination, followed by the introduction into a vacuum chamber. After it was subjected to vacuum evacuation to the order of $10^{-6}$ Pa, high speed atomic beam (acceleration voltage of 1 kV and Ar flow rate of 27 sccm) was irradiated onto each of the bonding surfaces over 120 seconds. Then, after the bonding surface 5*a* of the supporting substrate 5 and bonding surface of the lower electrode were contacted, they were subjected to the bonding by pressurization at 10000N over 2 minutes.

Then, one main surface 2*b* of the piezoelectric body 2 was subjected to grinding and polishing, to form the piezoelectric layer 2A having thickness of 1 μm. Then, the buffer layer composed of Cr and upper electrode composed of Au were film-formed on the second surface 2*c* of the piezoelectric layer 2A by sputtering method, to obtain the piezoelectric vibrating device.

The piezoelectric vibrating device was mounted in a package to perform the wire bonding. During the bonding step, heat (150° C.), ultrasonic vibration (80 kHz) and weight (500 gf) were applied on the piezoelectric vibrating device. As a result, the ratio of occurrence of defective articles, in which cracks or tipping were generated in the piezoelectric vibrating device 11, was proved to be 3%.

Figure 8:
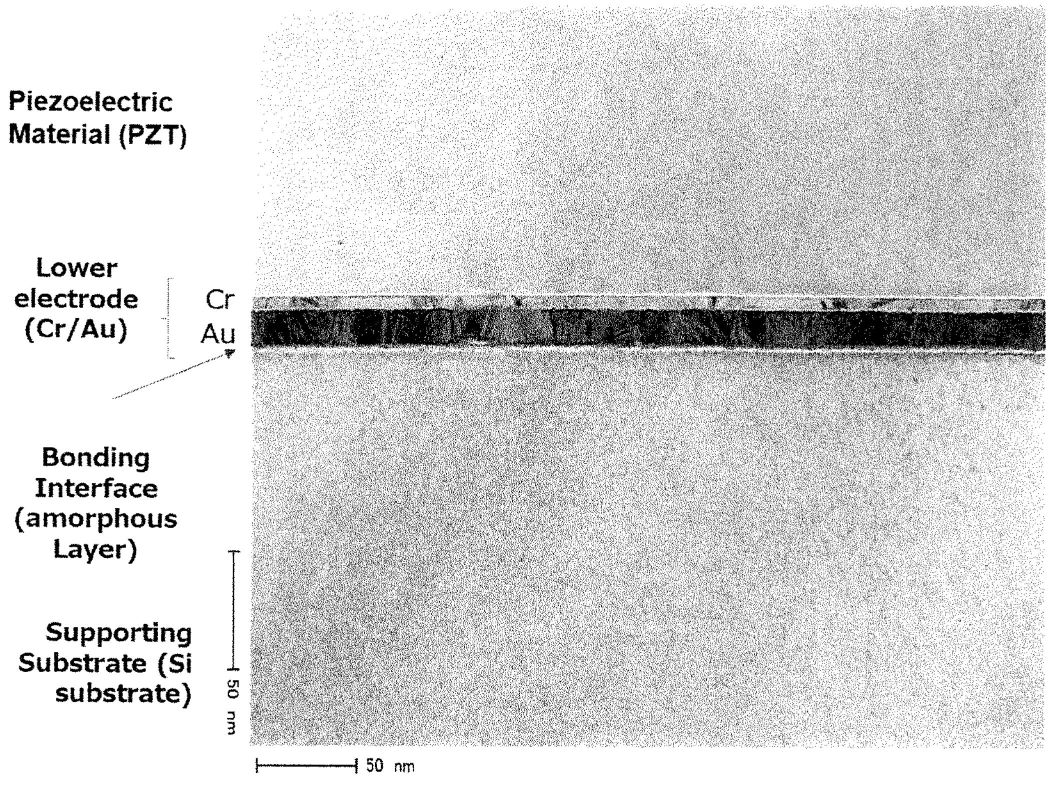
FIG. 8 is photograph taken by a transmission type electron microscope (TEM) of a cross section of a piezoelectric vibrating device.

FIG. 8 is a photograph (magnification of 2,000,000 folds) of a cross section of the piezoelectric vibrating device, taken by a transmission type electron microscope (TEM). In FIG. 8, the brighter region on the upper side corresponds with the piezoelectric layer, and Cr layer and Au layer were shown on the first surface of the piezoelectric layer as bands, respectively. Then, the lower side corresponds with the supporting substrate (silicon), and the band-shaped region between the supporting substrate and Au layer corresponds with an amorphous layer generated during the bonding.

The invention claimed is:

1. A piezoelectric vibrating substrate comprising:

a piezoelectric layer comprising a bulk piezoelectric material and having a first surface and a second surface on a opposite side of said first surface;

a lower electrode on said first surface of said piezoelectric layer;

a high-rigidity ceramic plate bonded with said lower electrode; and a supporting substrate bonded with said high-rigidity ceramic plate.

2. The piezoelectric vibrating substrate of claim 1, further comprising an amorphous layer present along an interface between said lower electrode and said high-rigidity ceramic plate.

3. The piezoelectric vibrating substrate of claim 1, further comprising an amorphous layer present along an interface between said high-rigidity ceramic plate and said supporting substrate.

4. The piezoelectric vibrating substrate of claim 1, further comprising an intermediate layer between said lower electrode and said high-rigidity ceramic plate.

5. The piezoelectric vibrating substrate of claim 1, further comprising an intermediate layer between said high-rigidity ceramic plate and said supporting substrate.

6. The piezoelectric vibrating substrate of claim 1, further comprising an upper electrode on said second surface of said piezoelectric layer.

7. A piezoelectric vibrating substrate comprising:

a piezoelectric layer comprising a bulk piezoelectric material and having a first surface and a second surface on an opposite side of said first surface;

a lower electrode on said first surface of said piezoelectric layer;

a supporting substrate; and an intermediate layer on a surface of said supporting substrate, wherein said intermediate layer comprises at least one of silicon oxide, tantalum pentoxide, titanium oxide, zirconium oxide, hafnium oxide, niobium oxide, bismuth oxide, alumina, magnesium oxide, aluminum nitride, silicon nitride, and silicon, and wherein an amorphous layer is present along a direct bonding interface of said lower electrode and said intermediate layer or along a direct bonding interface within said intermediate layer.

8. A piezoelectric vibrating device comprising:

said piezoelectric vibrating substrate of claim 7; and an upper electrode on said second surface of said piezoelectric layer.

* * * * *